United States Patent
Meng et al.

(10) Patent No.: US 11,735,611 B2
(45) Date of Patent: Aug. 22, 2023

(54) DRIVE BACKPLANE, MANUFACTURING METHOD THEREOF, DETECTION SUBSTRATE, AND DETECTION DEVICE

(71) Applicant: BOE Technology Group Co., Ltd., Beijing (CN)

(72) Inventors: Fanli Meng, Beijing (CN); Jiangbo Chen, Beijing (CN); Zeyuan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 87 days.

(21) Appl. No.: 17/355,664

(22) Filed: Jun. 23, 2021

(65) Prior Publication Data

US 2022/0223640 A1 Jul. 14, 2022

(30) Foreign Application Priority Data

Jan. 13, 2021 (CN) .......................... 202110043823.2

(51) Int. Cl.
*H01L 27/146* (2006.01)
*H01L 29/786* (2006.01)
*G01T 1/20* (2006.01)

(52) U.S. Cl.
CPC ...... *H01L 27/14616* (2013.01); *G01T 1/2018* (2013.01); *H01L 27/14603* (2013.01); *H01L 27/14659* (2013.01); *H01L 27/14663* (2013.01); *H01L 27/14689* (2013.01); *H01L 29/7869* (2013.01); *H01L 29/78633* (2013.01); *H01L 29/78666* (2013.01)

(58) Field of Classification Search
CPC ..... G01T 1/2018; G01T 1/249; G01T 1/2928; H01L 27/14616; H01L 27/14603; H01L 27/14659; H01L 27/14663; H01L 27/14689; H01L 29/78633; H01L 29/78666; H01L 29/7869
See application file for complete search history.

(56) References Cited

U.S. PATENT DOCUMENTS

| 11,445,138 B2* | 9/2022 | Tomita | H04N 5/378 |
| 2019/0252637 A1* | 8/2019 | Wu | H01L 51/0097 |
| 2021/0306587 A1* | 9/2021 | Tomita | H04N 5/3658 |

OTHER PUBLICATIONS

Wong, Beyond the conventional transistor, 2002, IBM J. Res. & Dev., vol. 46, No. 2/3 pp. 133-145, (May 2002). (Year: 2002).*
Textbook Sze, "Semiconductor Device, Physics and Technology", 1985. John Wiley & Sons, pp. 37-38 (Year: 1985).*

* cited by examiner

Primary Examiner — Nikolay K Yushin
(74) Attorney, Agent, or Firm — WHDA, LLP

(57) ABSTRACT

A drive backplane, a manufacturing method thereof, a detection substrate and a detection device. The drive backplane includes: a base plate and multiple drive modules disposed on the base plate. Each drive module includes a reset transistor, a read transistor, an amplifier transistor and a memory capacitor; the reset transistor is connected to the memory capacitor, the memory capacitor is connected to a photosensor, the amplifier transistor is connected to the memory capacitor, and the read transistor is connected to the amplifier transistor; wherein an active layer in the amplifier transistor is made of amorphous silicon or an oxide semiconductor.

20 Claims, 5 Drawing Sheets

DRIVE BACKPLANE, MANUFACTURING METHOD THEREOF, DETECTION SUBSTRATE, AND DETECTION DEVICE

CROSS REFERENCE TO RELEVANT APPLICATIONS

The application claims priority to Chinese patent application filed in the China National Intellectual Property Administration on Jan. 13, 2021 with application number 202110043823.2 and title of "A DRIVE BACKPLANE, MANUFACTURING METHOD THEREOF, DETECTION SUBSTRATE, AND DETECTION DEVICE", the entire contents of which are hereby incorporated by reference.

TECHNICAL FIELD

The present disclosure relates to the technical field of photoelectric technology, in particular to a drive backplane, a manufacturing method thereof, a detection substrate, and a detection device.

BACKGROUND

In the field of digital medical imaging, detection substrates are widely used as detection sensor components. The drive backplane in the detection substrates is able to read electric signals generated by photosensors, and transistors in the drive backplane may have an influence on noises of the detection substrates due to its structure and electrical properties.

At present, amplifier transistors are configured in the drive backplane to lower noises by means of the signal gains of the amplifier transistors.

SUMMARY

The present disclosure provides a drive backplane, a manufacturing method thereof, a detection substrate, and a detection device.

The present disclosure provides a drive backplane, comprising a base plate and multiple drive modules disposed on the base plate, wherein each said drive module comprises a reset transistor, a read transistor, an amplifier transistor and a memory capacitor;

the reset transistor is connected to the memory capacitor, and the reset transistor is configured to reset the memory capacitor;

the memory capacitor is connected to a photosensor, and the memory capacitor is configured to store an electric signal generated by the photosensor;

the amplifier transistor is connected to the memory capacitor, and the amplifier transistor is configured to amplify the electric signal stored in the memory capacitor;

the read transistor is connected to the amplifier transistor, and the read transistor is configured to read an electric signal amplified by the amplifier transistor;

wherein, an active layer in the amplifier transistor is made of amorphous silicon or an oxide semiconductor.

Optionally, the reset transistor comprises a first active layer, a first grid insulating layer, a first gate, an interlayer dielectric layer and a first source-drain electrode that are sequentially disposed on a side of the base plate;

wherein, a first source in the first source-drain electrode is connected to the first active layer by means of a first via hole penetrating through the interlayer dielectric layer, and a first drain in the first source-drain electrode is connected to the first active layer by means of a second via hole penetrating through the interlayer dielectric layer.

Optionally, the first active layer comprises a first undoped region and a first doped regions located on two sides of the first undoped region; and the first source is connected to the first layer located at the first doped region, and the first drain is connected to the first layer located at the first doped region.

Optionally, in case where the reset transistor is a P-type transistor, the first doped regions are doped with boron ions;

or, in case where the reset transistor is an N-type transistor, the first doped regions are doped with phosphorus ions.

Optionally, the read transistor comprises a second active layer, the first grid insulating layer, a second gate, the interlayer dielectric layer and a second source-drain electrode that are sequentially disposed on a side of the base plate;

a second source in the second source-drain electrode is connected to the second active layer by means of a third via hole penetrating through the interlayer dielectric layer, and a second drain in the second source-drain electrode is connected to the second active layer by means of a fourth via hole penetrating through the interlayer dielectric layer;

wherein, the first active layer and the second active layer are disposed on a same layer, the first gate and the second gate are disposed on a same layer, and the first source-drain electrode and the second source-drain electrode are disposed on a same layer.

Optionally, the second active layer comprises a second undoped region and a second doped regions located on two sides of the second undoped region; and the second source is connected to the second active layer located at the second doped region, the second drain is connected to the second active layer located at the second doped region.

Optionally, in case where the read transistor is a P-type transistor, the second doped regions are doped with boron ions;

or, in case where the read transistor is an N-type transistor, the second doped regions are doped with phosphorus ions.

Optionally, the first active layer and the second active layer are made of polysilicon.

Optionally, the drive backplane further comprises a buffer layer and a second grid insulating layer that are disposed between the base plate and the first active layer, and the buffer layer is disposed on a side, away from the base plate, of the second grid insulating layer;

the amplifier transistor comprises a third gate, the second grid insulating layer, a third active layer and a third source-drain electrode that are sequentially disposed on the base plate; the second source in the second source-drain electrode is connected to a third drain in the third source-drain electrode by means of a fifth via hole penetrating through the interlayer dielectric layer;

wherein, an orthographic projection of the third active layer on the base plate does not overlap with an orthographic projection of the buffer layer on the base plate.

Optionally, the third active layer is made of amorphous silicon, and comprises a first undoped amorphous silicon layer disposed on the second grid insulating layer and a first doped amorphous silicon layer disposed on the first undoped amorphous silicon layer;

or, the third active layer is made of an oxide semiconductor.

Optionally, the drive backplane further comprises a light shielding layer disposed on the base plate, and the light shielding layer located on the same layer as the third gate; and the second grid insulating layer covers the light shielding layer.

Optionally, the drive backplane further comprises a first passivation layer covering the interlayer dielectric layer, the first source-drain electrode and the second source-drain electrode, and a first flat layer disposed on the first passivation layer;

wherein, the first passivation layer is made of silicon nitride and/or silicon oxide, and the first flat layer is made of resin.

Optionally, the drive backplane further comprises a seventh via hole penetrating through the first flat layer, the first passivation layer, the interlayer dielectric layer and the second grid insulating layer, and an eighth via hole penetrating through the first flat layer and the first passivation layer;

wherein the seventh via hole is configured to connect the third gate of the amplifier transistor and a first photosensitive electrode of the photosensor, and the eighth via hole is configured to connect the first source and the first photosensitive electrode.

Optionally, the drive backplane further comprises a second passivation layer covering the interlayer dielectric layer, the first source-drain electrode and the second source-drain electrode;

the amplifier transistor comprises a fourth gate, the second passivation layer, a fourth active layer and a fourth source-drain electrode that are sequentially disposed on the interlayer dielectric layer;

wherein, the fourth gate is disposed on a same layer as the first source-drain electrode and the second source-drain electrode and is connected to the first active layer in the first source-drain electrode; a fourth drain in the fourth source-drain electrode is connected to the second source in the second source-drain electrode by means of a sixth via hole penetrating through the second passivation layer.

Optionally, the fourth active layer is made of amorphous silicon, and comprises a second undoped amorphous silicon layer disposed on the second passivation layer and a second doped amorphous silicon layer disposed on the second undoped amorphous silicon layer;

or, the fourth active layer is made of an oxide semiconductor.

Optionally, in case where the fourth active layer is made of amorphous silicon, the second passivation layer is made of silicon nitride, and the thickness of the second passivation layer is 300 nm-500 nm;

or, in case where the fourth active layer is made of the oxide semiconductor, the second passivation layer is made of silicon oxide, and the thickness of the second passivation is 100 nm-200 nm.

Optionally, the memory capacitor comprises a first polar plate and a second polar plate that are arranged oppositely, the first polar plate is disposed on a same layer as the first source-drain electrode, the second polar plate is disposed on a same layer as a fourth source-drain electrode of the amplifier transistor or the third source-drain electrode, and the first polar plate is connected to the first source in the first source-drain electrode;

wherein, an orthographic projection of the first polar plate on the base plate at least partially overlaps with an orthographic projection of the second polar plate on the base plate.

The present disclosure further provides a manufacturing method of a drive backplane, comprising providing a base plate; and forming multiple drive modules on the base plate, wherein each said drive module comprises a reset transistor, a read transistor, an amplifier transistor and a memory capacitor;

wherein, the reset transistor is connected to the memory capacitor, and the reset transistor is configured to reset the memory capacitor;

the memory capacitor is connected to a photosensor, and the memory capacitor is configured to store an electric signal generated by the photosensor;

the amplifier transistor is connected to the memory capacitor, and the amplifier transistor is configured to amplify the electric signal stored in the memory capacitor;

the read capacitor is connected to the amplifier transistor, and the read capacitor is configured to read the electric signal amplified by the amplifier transistor; and an active layer in the amplifier transistor is made of amorphous silicon or an oxide semiconductor.

The present disclosure further provides a detection substrate, comprising a photosensor, and the above drive backplane, wherein the photosensor is connected to the drive backplane.

The present disclosure further provides a detection device, comprising the above detection substrate.

The above description is only an overview of the technical solution of this disclosure, which can be implemented according to the contents of the specification in order to understand the technical means of this disclosure more clearly, and in order to make the above and other objects, features and advantages of this disclosure more obvious and understandable, the detailed description of this disclosure will be given below.

BRIEF DESCRIPTION OF THE DRAWINGS

In order to explain the technical solution in the embodiments of the disclosure or related arts more clearly, the drawings used in the description of the embodiments or related arts will be briefly introduced below. Obviously, the drawings in the following description are only some embodiments of the disclosure, and for those of ordinary skill in the art, other drawings can be obtained according to these drawings without paying creative labor.

DETAILED DESCRIPTION

To make the above purposes, features and advantages of the present disclosure clearer and easily understood, the present disclosure will be described in further detail below in conjunction with the accompanying drawings and specific implementations. Obviously, the embodiments in the following description are merely illustrative ones, and are not all possible ones of the disclosure. All other embodiments obtained by those ordinarily skilled in the art based on the following ones without creative labor should also fall within the protection scope of the disclosure.

In the related art, the active layer of each amplifier transistor in the drive backplane is made of polysilicon, and is specifically manufactured as follows: an amorphous silicon layer is deposited and is then crystallized by Excimer Laser Annealing (ELA) to be converted into a polysilicon layer.

However, under the influence of crystallization equipment, processes and other factors, the degree of crystallization of the active layers in the amplifier transistors of the drive backplane is non-uniform when the active layers are crystallized by laser annealing, which makes the carrier mobility of the amplifier transistors non-uniform, so the signal gains of the amplifier transistors are different, that is, the uniformity of the signal gains of the amplifier transistors in the drive backplane is unsatisfying, and consequentially, the intensities of electric signals generated by photosensors are not uniform after being amplified by the amplifier transistors, which may cause fixed image noises and defective pixels and lines, and the imaging quality of images according to amplified signal lines is poor.

In view of this, in the embodiments of the present disclosure, multiple amplifier transistors are disposed in a drive backplane, the active layers in the amplifier transistors are made of amorphous silicon or oxide semiconductors to ensure that the carrier mobility in the amplifier transistors in the drive backplane is uniform, so that the uniformity of gains of the amplifier transistors in the drive backplane is improved, and image noises and even defective pixel and lines caused by non-uniform intensities of electric signals amplified by the amplifier transistors are avoided, thus improving the imaging quality of images generated according to amplified signal lines.

Figure 1:
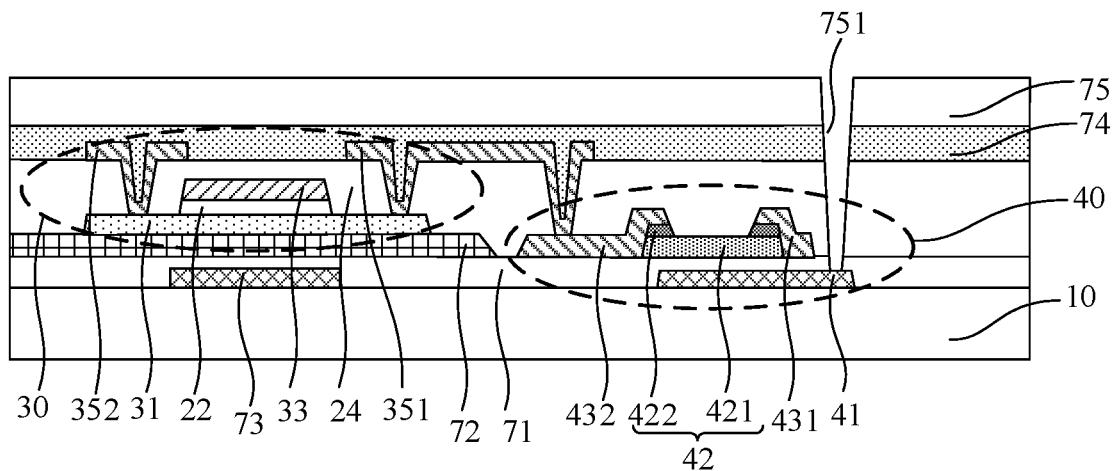
FIG. 1 illustrates a sectional view of a read transistor and an amplifier transistor in a first drive backplane according to one embodiment of the present disclosure.
Figure 2:
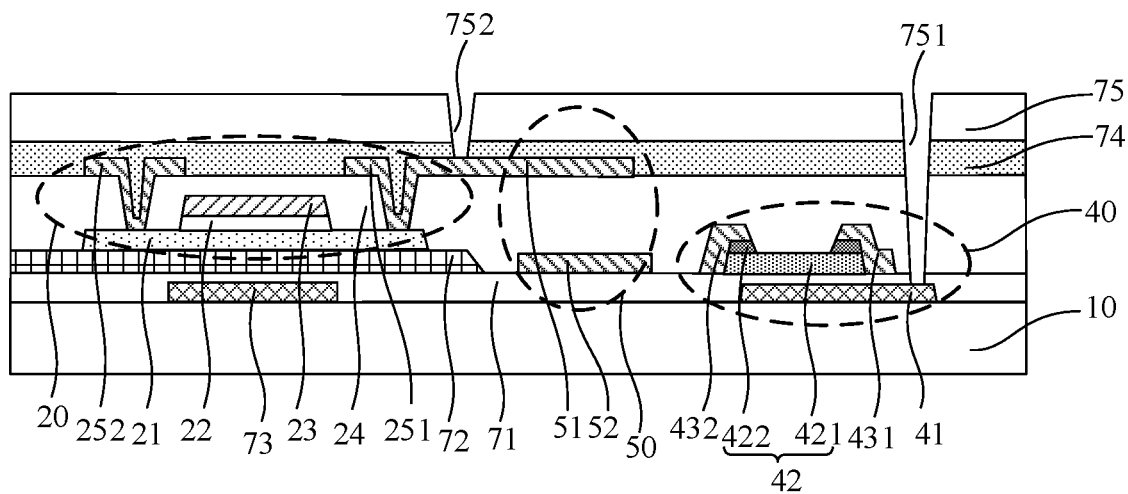
FIG. 2 illustrates a sectional view of a reset transistor and an amplifier transistor in the first drive backplane according to one embodiment of the present disclosure.
Figure 3:
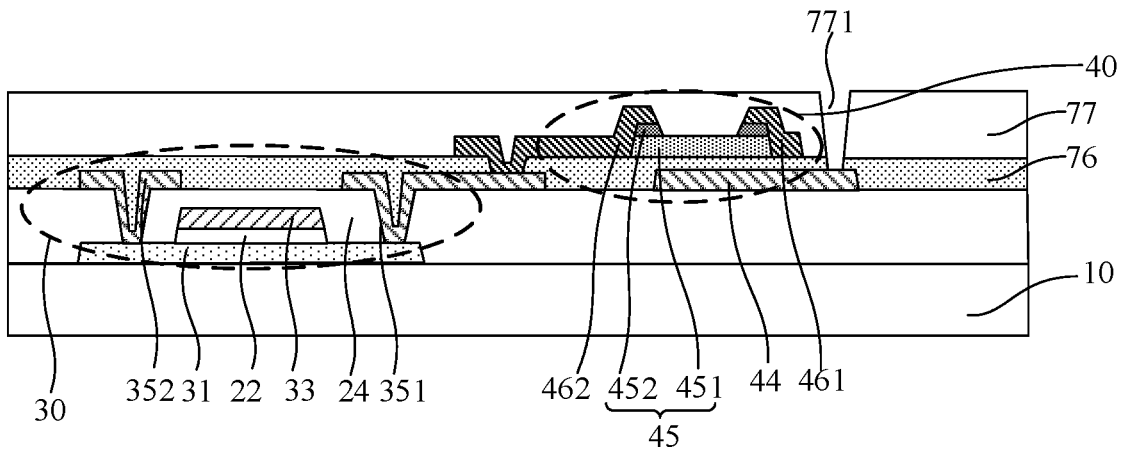
FIG. 3 illustrates a sectional view of a read transistor and an amplifier transistor in a second drive backplane according to one embodiment of the present disclosure.
Figure 4:
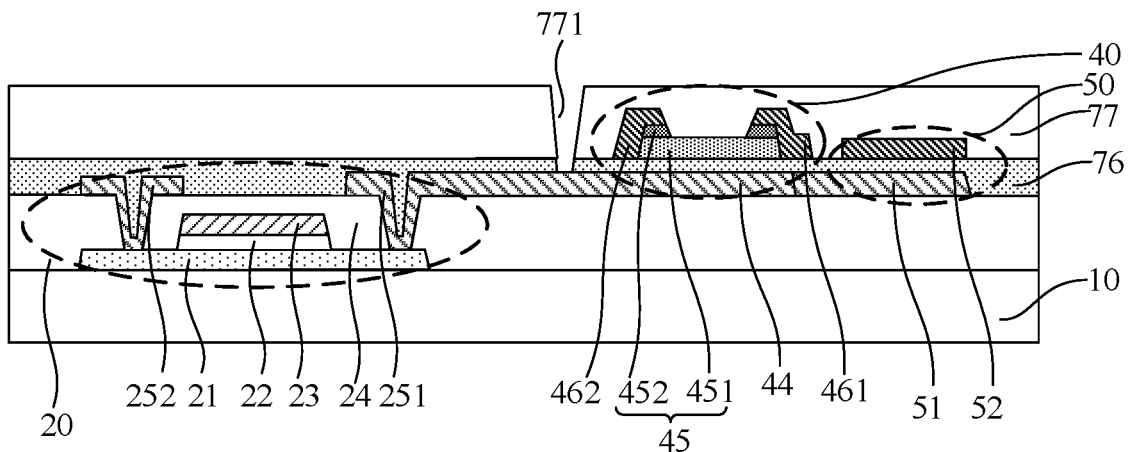
FIG. 4 illustrates a sectional view of a reset transistor and an amplifier transistor in the second drive backplane according to one embodiment of the present disclosure.
Figure 5:
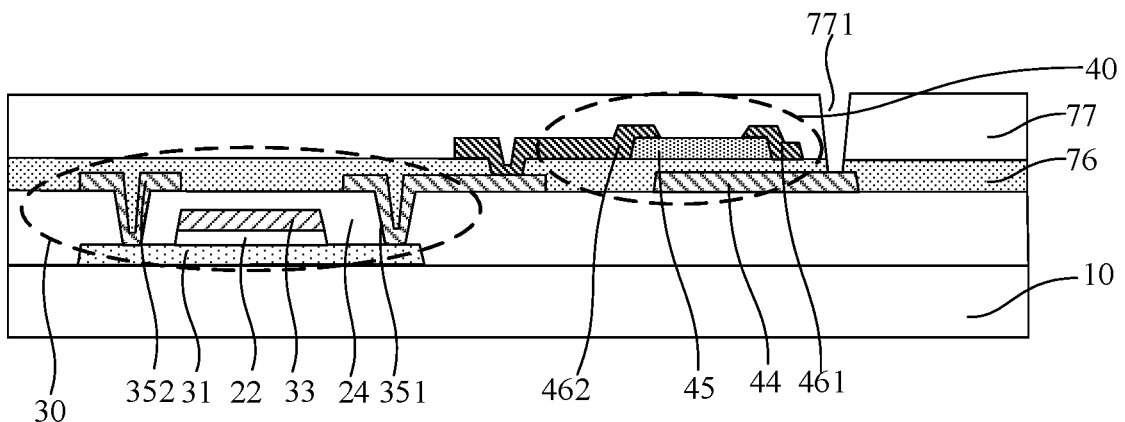
FIG. 5 illustrates a sectional view of a read transistor and an amplifier transistor in a third drive backplane according to one embodiment of the present disclosure.
Figure 6:
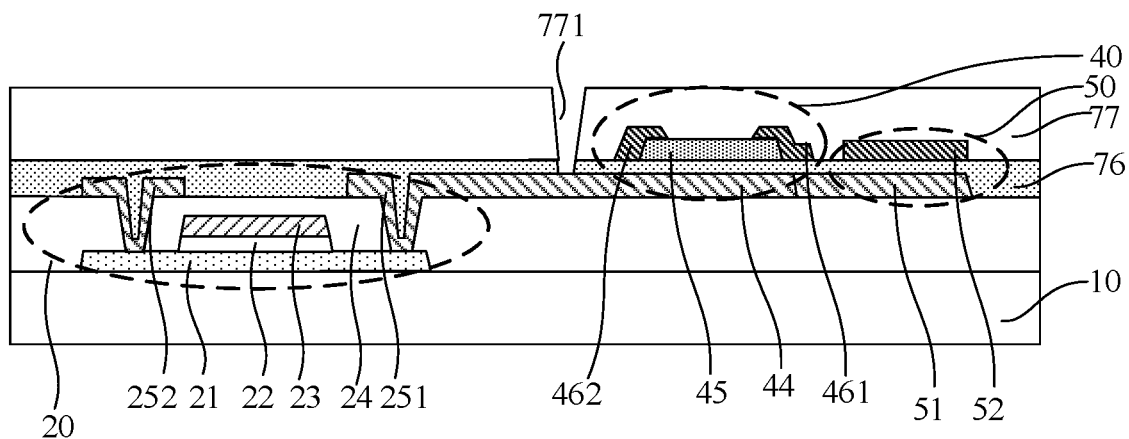
FIG. 6 illustrates a sectional view of a reset transistor and an amplifier transistor in the third drive backplane according to one embodiment of the present disclosure.

Refer to FIG. 1 which illustrates a sectional view of a read transistor and an amplifier transistor in a first drive backplane according to one embodiment of the present disclosure, FIG. 2 which illustrates a sectional view of a reset transistor and an amplifier transistor in the first drive backplane according to one embodiment of the present disclosure, FIG. 3 which illustrates a sectional view of a read transistor and an amplifier transistor in a second drive backplane according to one embodiment of the present disclosure, FIG. 4 which illustrates a sectional view of a reset transistor and an amplifier transistor in the second drive backplane according to one embodiment of the present disclosure, FIG. 5 which illustrates a sectional view of a read transistor and an amplifier transistor in a third drive backplane according to one embodiment of the present disclosure, and FIG. 6 illustrates a sectional view of a reset transistor and an amplifier transistor in the third drive backplane according to one embodiment of the present disclosure.

This embodiment of the present disclosure provides a drive backplane, comprising: a base plate 10 and multiple drive modules disposed on the base plate 10, wherein each drive module comprises a reset transistor 20, a read transistor 30, an amplifier transistor 40 and a memory capacitor 50.

The reset transistor 20 is connected to the memory capacitor 50 and is configured to reset the memory capacitor 50; the memory capacitor 50 is connected to a photosensor and is configured to store an electric signal generated by the photosensor; the amplifier transistor 40 is connected to the memory capacitor 50 and is configured to amplify the electric signal stored in the memory capacitor 50; the read transistor 30 is connected to the amplifier transistor 40 and is configured to read the electric signal amplified by the amplifier transistor 40; wherein, an active layer in the amplifier transistor 40 is made of amorphous silicon or an oxide semiconductor.

In an actual product, the base plate 10 may be a glass base plate, multiple drive modules distributed in an array are disposed on the base plate 10, and each drive module comprises the reset transistor 20, the read transistor 30, the amplifier transistor 40 and the memory capacitor 50.

In an actual drive process, the reset transistor 20 is controlled to be turned on at first, and then the memory capacitor 50 is reset by the reset transistor 20 to release electric charges stored in the memory capacitor 50; after the photosensor converts an optical signal into an electric signal, the memory capacitor 50 stores the electric signal generated by the photosensor and controls a grid voltage of the amplifier transistor 40 based on the electric signal generated by the photosensor, the amplifier transistor 40 is controlled to work in a saturation region based on the grid voltage of the amplifier transistor 40 and a Vdd voltage provided by a source of the amplifier transistor, and then, the electric signal stored in the memory capacitor 50 is amplified by the amplifier transistor 40; and finally, the read transistor 30 is controlled to be turned on to read the electric signal amplified by the amplifier transistor 40.

Wherein, active layers in the reset transistor 20 and the read transistor 30 are both made of polysilicon, and an active layer in the amplifier transistor 40 is made of amorphous silicon or an oxide semiconductor.

The amplifier transistors 40 are additionally disposed in the drive backplane, and noises are equivalently lowered by means of signal gains of the amplifier transistors 40, and thus, a high signal to noise ratio is provided under low dose conditions; in addition, the active layers in the amplifier transistors 40 are made of amorphous silicon or oxide semiconductors and are not crystallized by laser annealing, so that the carrier mobility of the amplifier transistors 40 is uniform, the uniformity of the gains of the amplifier transistors 40 is improved, and image noises and even defective pixels and lines caused by non-uniform intensities of electric signals amplified by the amplifier transistors 40 are avoided, thus improving the imaging quality of images generated according to amplified signal lines.

As shown in FIG. 2, FIG. 4 and FIG. 6, the reset transistor 20 comprises a first active layer 21, a first grid insulating layer 22, a first gate 23, an interlayer dielectric layer 24 and a first source-drain electrode that are sequentially disposed on one side of the base plate 10; the first source-drain electrode comprises a first source 251 and a first drain 252 that are disposed on the same layer; wherein, the first source 251 in the first source-drain electrode is connected to the first active layer 21 by means of a first via hole penetrating through the interlayer dielectric layer 24, and the first drain 252 in the first source-drain electrode is connected to the first active layer 21 by means of a second via hole penetrating through the interlayer dielectric layer 24.

The first active layer 21, namely an active layer of the reset transistor 20, is made of polysilicon, and includes a first undoped region and a first doped regions located on two sides of the first undoped region, wherein the first active layer 21 located at a junction of the first active layer 21 and the first source 251 is the first active layer 21 located at the first doped region, and the first active layer 21 located at a junction of the first active layer 21 and the first drain 252 is also the first active layer 21 located at the first doped region. The first active layer 21 in contact with the first source 251 and the first drain 252 is doped, so that ohmic contact between the first active layer 21 and the first source 251 and ohmic contact between the first active layer 21 and the first drain 252 are increased.

As shown in FIG. 1, FIG. 3 and FIG. 5, the read transistor 30 comprises a second active layer 31, the first grid insulating layer 22, a second gate 33, the interlayer dielectric layer 24 and a second source-drain electrode that are sequentially disposed on one side of the base plate 10; the second source-drain electrode comprises a second source 351 and a second drain 352 that are disposed on the same layer; the second source 351 in the second source-drain electrode is connected to the second active layer 31 by means of a third via hole penetrating through the interlayer dielectric layer 24, and the second drain 352 in the second source-drain electrode is connected to the second active layer 31 by means of a fourth via hole penetrating through the interlayer dielectric layer 24; wherein, the first active layer 21 and the second active layer 31 are disposed on the same layer, the first gate 23 and the second gate 33 are disposed on the same layer, and the first source-drain electrode and the second source-drain electrode are disposed on the same layer.

The second active layer 31, namely an active layer of the read transistor 30, is made of polysilicon, and comprises a second undoped region and a second doped regions located on two sides of the second undoped region, wherein the second active layer 31 located at a junction of the second active layer 31 and the second source 351 is the second active layer 31 located at the second doped region, and the second active layer 31 located at a junction of the second active layer 31 and the second drain 352 is also the second active layer 31 located at the second doped region. The second active layer 31 in contact with the second source 351 and the second drain 352 is doped, so that ohmic contact between the second active layer 31 and the second source 351 and ohmic contact between the second active layer 31 and the second drain 352 are increased.

It should be noted that the reset transistor 20 and the read transistor 30 may be N-type transistors or P-type transistors. When the reset transistor 20 is a P-type transistor, the first doped regions of the first active layer 21 may be doped with boron ions; or, when the reset transistor 20 is an N-type transistor, the first doped regions of the first active layer 21 may be doped with phosphorus ions. Correspondingly, when the read transistor 30 is a P-type transistor, the second doped regions of the second active layer 31 may be doped with boron ions; or, when the read transistor 30 is an N-type transistor, the second doped regions of the second active layer 31 may be doped with phosphorus ions.

In one optional implementation of the present disclosure, as shown in FIG. 1 and FIG. 2, the drive backplane further comprises a buffer layer 72 and a second grid insulating layer 71 that are disposed between the base plate 10 and the first active layer 21, and the buffer layer 72 is disposed on a side, away from the base plate 10, of the second grid insulating layer 71; the amplifier transistor 40 comprises a third gate 41, a second grid insulating layer 71, a third active layer 42 and a third source-drain electrode that are sequentially disposed on the base plate 10; the third source-drain electrode comprises a third source 431 and a third drain 432 that are disposed on the same layer; the second source 351 in the second source-drain electrode is connected to the third drain 432 in the third source-drain electrode by means of a fifth via hole penetrating through the interlayer dielectric layer 24; wherein, an orthographic projection of the third active layer 42 on the base plate 10 does not overlap with an orthographic projection of the buffer layer 72 on the base plate 10.

Specifically, the third gate 41 in the amplifier transistor 40 is disposed on the base plate 10, the second grid insulating layer 71 covers the third gate 41 and the base plate 10, the buffer layer 72 is disposed on the second grid insulating layer 71, and the first active layer 21 and the second active layer 31 are both disposed on the buffer layer 72, that is, the first active layer 21 and the second active layer 31 are both disposed on a side, away from the base plate 10, of the buffer layer 72; the first grid insulating layer 22 is disposed on the first active layer 21 and the second active layer 31, and the first gate 23 and the second gate 33 are disposed on the first grid insulating layer 22; the third active layer 42 is disposed on the second grid insulating layer 71, and the third source-drain electrode is also disposed on the second grid insulating layer 71 and partially covers the third active layer 42; the interlayer dielectric layer 24 covers the buffer layer 72, the first active layer 21, the second active layer 31, the first grid insulating layer 22, the first gate 23, the second gate 33, the third source-drain electrode, the third active layer 42 and the second grid insulating layer 71; and first source-drain electrode and the second source-drain electrode are disposed on the interlayer dielectric layer 24.

It's worth noting that the orthographic projection of the third active layer 42 on the base plate 10 does not overlap with the orthographic projection of the buffer layer 72 on the base plate 10, that is, the buffer layer 72 is only located in an area where the reset transistor 20 and the read transistor 30 are located, and the material, in an area where the amplifier transistor 40 is located, of the amplifier transistor 40 is etched, so the amplifier transistor 40 only comprises the third gate 41, the second grid insulating layer 71, the third active layer 42 and the third source-drain electrode that are stacked together.

The buffer layer 72 is a laminated structure comprising silicon nitride and silicon oxide, and has an insulation effect. In the actual manufacturing process, film layers corresponding to the first active layer 21 of the reset transistor 20, the second active layer 31 of the read transistor 30 and the third active layer 42 of the amplifier transistor 40 are deposited synchronously, that is, after the buffer layer 72 is formed by a patterning process, an amorphous silicon film is deposited in the area where the reset transistor 20, the read transistor 30 and the amplifier transistor 40 are located; the amorphous silicon film is patterned to form a pattern corresponding to the first active layer 21, the second active layer 31 and the third active layer 42; then, the whole drive backplane comprising the patterned amorphous silicon film is processed by excimer laser annealing; the buffer layer 72 is disposed in the area where the reset transistor 20 and the read transistor 30 are located, so that amorphous silicon in this area is maintained at a high temperature and is crystallized to be converted into polysilicon; however, the area where the amplifier transistor 40 is located is not provided with the buffer layer 72, so amorphous silicon at the position of the amplifier transistor 40 cannot be maintained in a high temperature for a long time and will not be crystallized, and the amorphous silicon at this position is still amorphous silicon.

By disposing the buffer layer 72 in the area where the reset transistor 20 and the read transistor 30 are located, the process steps are simplified, the first active layer 21 and the second active layer 31 may be made of polysilicon, and the third active layer 42 may be made of amorphous silicon. It should be noted that, in this case, the third active layer 42 refers to a first undoped amorphous silicon layer 421 in the third active layer 42.

As shown in FIG. 1 and FIG. 2, the third active layer 42 is made of amorphous silicon, and comprises the first undoped amorphous silicon layer 421 disposed on the second grid insulating layer 71, and a first doped amorphous silicon layer 422 disposed on the first undoped amorphous silicon layer 421.

Specifically, the first doped amorphous silicon layer 422 is located on part of the first undoped amorphous silicon layer 421, and the first doped amorphous silicon layer 422 in a channel region of the first undoped amorphous silicon layer 321 is etched, and the third source-drain electrode actually covers the first doped amorphous silicon layer 422 in the third active layer 42.

Wherein, the first undoped amorphous silicon layer 421 is made of amorphous silicon, and is not doped with any ions; and the first doped amorphous silicon layer 422 is made of amorphous silicon, and is doped with N-type ions, such as phosphorus ions.

The third active layer 42 is an active layer of the amplifier transistor 40. When the third active layer 42 in the amplifier transistor 40 is made of amorphous silicon, the first undoped amorphous silicon layer 421 in the third active layer 42 is not crystallized during the laser annealing process of the first active layer 21 and the second active layer 31, and the laser annealing process is not involved either in the subsequent formation process of the first doped amorphous silicon layer 422, so the degree of crystallization of the third active layer 42 in the amplifier transistor 40 is not involved, which makes the carrier mobility of the amplifier transistors 40 uniform, thus improving the uniformity of the gains of the amplifier transistors 40 in the drive backplane.

The third active layer 42 is made of an oxide semiconductor, and the oxide semiconductor may specifically be Indium Gallium Zinc Oxide (IGZO), Indium Tin Gallium Oxide (ITGO), or other materials. When the third active layer 42 in the amplifier transistor 40 is made of the oxide semiconductor, the laser annealing process for crystallization is not needed, so the degree of crystallization of the third active layer 42 in the amplifier transistor 40 is not involved, which makes the carrier mobility of the amplifier transistors 40 uniform, thus improving the uniformity of the gains of the amplifier transistors 40 in the drive backplane.

Furthermore, as shown in FIG. 1 and FIG. 2, the drive backplane further comprises a light shielding layer 73 disposed on the base plate 10 and located on the same layer as the third gate 41, and the second grid insulating layer 71 covers the light shielding layer 73.

The light shielding layer 73 is disposed on the base plate 10 and is located in channel regions of the reset transistor 20 and the read transistor 30 to shield the channel regions of the reset transistor 20 and the read transistor 30 against light, so that external ambient light will not be irradiated into the channel regions of the reset transistor 20 and the read transistor 30 through the base plate 10, thus protecting the performance of the reset transistor 20 and the read transistor 30 forming being affected.

In this embodiment of the present disclosure, as shown in FIG. 1 and FIG. 2, the drive backplane further comprises a first passivation layer 74 covering the interlayer dielectric layer 24, the first source-drain electrode and the second source-drain electrode, and a first flat layer 75 disposed on the first passivation layer 74. Wherein, the first passivation layer 74 may be made of silicon nitride and/or silicon oxide, and the first flat layer 78 is made of resin.

The drive backplane further comprises a seventh via hole 751 penetrating through the first flat layer 75, the first passivation layer 74, the interlayer dielectric layer 24 and the second grid insulating layer 71, and an eighth via hole 752 penetrating through the first flat layer 75 and the first passivation layer 74, wherein the third gate 41 of the amplifier transistor 40 is connected to a first photosensitive electrode (lower electrode) of the photosensor by means of the seventh via hole 751, and the first source 251 in the first source-drain electrode of the reset transistor 20 is connected to the first photosensitive electrode (lower electrode) of the photosensor by means of the eighth via hole 752, so that the third gate 41 of the amplifier transistor 40 is connected to the first source 251 in the first source-drain electrode of the reset transistor 20 by means of the first photosensitive electrode.

In another optional implementation of the present disclosure, as shown in FIG. 3 to FIG. 6, the drive backplane further comprises a second passivation layer 76 covering the interlayer dielectric layer 24, the first source-drain electrode and the second source-drain electrode; the amplifier transistor 40 comprises a fourth gate 44, the second passivation layer 76, a fourth active layer 45 and a fourth source-drain electrode that are sequentially disposed on the interlayer dielectric layer 24; the fourth source-drain electrode comprises a fourth source 461 and a fourth drain 462 that are disposed on the same layer; wherein, the fourth gate 44 is disposed on the same layer as the first source-drain electrode and the second source-drain electrode and is connected to the first source 251 in the first source-drain electrode; and the fourth drain 462 in the fourth source-drain electrode is connected to the second source 351 in the second source-drain electrode by means of a sixth via hole penetrating through the second passivation layer 76.

Specifically, the first active layer 21 and the second active layer 31 are directly disposed on the base plate 10, the first grid insulating layer 22 is disposed on the first active layer 21 and the second active layer 31, and the first gate 23 and the second gate 33 are disposed on the first grid insulating layer 22; the interlayer dielectric layer 24 covers the first active layer 21, the second active layer 31, the first grid insulating layer 22, the first gate 23, the second gate 33 and the base plate 10, and the first source-drain electrode, the second source-drain electrode and the fourth gate 44 are all disposed on the interlayer dielectric layer 24; the second passivation layer 76 covers the interlayer dielectric layer 24, the first source-drain electrode, the second source-drain electrode and the fourth gate 44, and the fourth active layer 45 is disposed on the second passivation layer 76, the fourth source-drain electrode is also disposed on the second passivation layer 76 and partially covers the fourth active layer 45.

As shown in FIG. 3 and FIG. 4, the fourth active layer 45 is made of amorphous silicon, and comprises a second undoped amorphous silicon layer 451 disposed on the second passivation layer 76, and a second doped amorphous silicon layer 452 disposed on the second undoped amorphous silicon layer 451.

Specifically, the second doped amorphous silicon layer 452 is located on part of the second undoped amorphous silicon layer 451, and the second doped amorphous silicon layer 452 in a channel region of the second undoped amorphous silicon layer 451 is etched, so the fourth source-drain electrode actually covers the second doped amorphous silicon layer 452 in the fourth active layer 45.

Wherein, the second undoped amorphous silicon layer 451 is made of amorphous silicon, and is not doped with any ions; and the second doped amorphous silicon layer 452 is made of amorphous silicon, and is doped with N-type ions.

The fourth active layer 45 is an active layer of the amplifier transistor 40. When the fourth layer 45 in the amplifier transistor 40 is made of amorphous silicon, the second undoped amorphous silicon layer 451 and the second doped amorphous silicon layer 452 may be formed by a thin-film deposition process and a patterning process and do not need to be processed by laser annealing, so the degree of crystallization of the fourth active layer 45 in the amplifier transistor 40 is not involved, which makes the carrier mobility of the amplifier transistors uniform, thus improving the uniformity of the gains of the amplifier transistors of the drive backplane.

It should be noted that the fourth active layer 45 may only comprise an amorphous silicon layer when made of amorphous silicon, the channel region is not doped with any ions, and a non-channel region is doped with N-type ions.

As shown in FIG. 5 and FIG. 6, the fourth active layer 45 is made of an oxide semiconductor, and the oxide semiconductor may be IGZO, ITGO or other materials. When made of the oxide semiconductor, the fourth active layer 45 in the amplifier transistor 40 only comprises an oxide semiconductor layer, which is formed by a thin-film deposition process and a patterning process and does not need to be processed by laser annealing, so that the degree of crystallization of the fourth active layer 45 in the amplifier transistor 40 is not involved, which makes the carrier mobility of the amplifier transistors 40 uniform, thus improving the uniformity of the gains of the amplifier transistors 40.

It should be noted that when the fourth active layer 45 is made of amorphous silicon, the second passivation layer 76 may be made of silicon nitride or silicon oxide, is preferably made of silicon nitride because of the dielectric constant of silicon nitride is greater than that of silicon oxide, and has a thickness of 300 nm-500 nm; or, when the fourth active layer 45 is made of the oxide semiconductor, the second passivation layer 76 may be made of silicon oxide, and has a thickness of 100 nm-200 nm.

In this embodiment of the present disclosure, as shown in FIG. 3 to FIG. 6, the drive backplane further comprises a second flat layer 77 covering the second passivation layer 76, the fourth active layer 45 and the fourth source-drain electrode. The second flat layer 77 is made of resin.

The drive backplane further comprises a ninth via hole 771 penetrating through the second flat layer 77 and the second passivation layer 76, and the fourth gate 44 of the amplifier transistor 40 is connected to the first source 251 of the reset transistor 20 and the first photosensitive electrode (lower electrode) of the photosensor by means of the ninth via hole 771.

In this embodiment of the present disclosure, the memory capacitor 50 comprises a first polar plate 51 and a second polar plate 52 which are arranged oppositely, wherein the first polar plate 51 is disposed on the same layer as the first drain-source electrode, the second polar plate 52 is disposed on the same layer as the fourth source-drain electrode or the third source-drain electrode, and the first polar plate 51 is connected to the first source 251 in the first source-drain electrode; wherein, an orthographic projection of the first polar plate 51 on the base plate 10 at least partially overlaps with an orthographic projection of the second polar plate 52 on the base plate 10.

As shown in FIG. 2, the first polar plate 51 is disposed on the same layer as the first source-drain electrode, the second polar plate 52 is disposed on the same layer as the third source-drain plate, and an orthographic projection of the first polar plate 51 on the base plate 10 at least partially overlaps with the orthographic projection of the second polar plate 52 on the base plate 10, so that the memory capacitor 50 is formed by the first polar plate 51 and the second polar plate 52, and in this case, the interlayer dielectric layer 24 is used as an insulating dielectric layer between the first polar plate 51 and the second polar plate 52.

Figure 7:
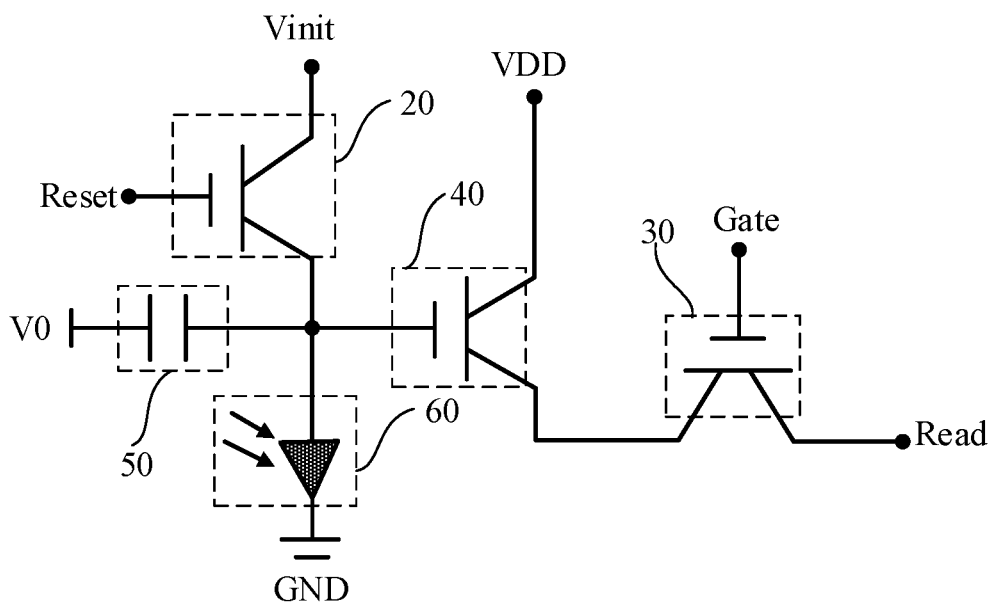
FIG. 7 illustrates an equivalent circuit diagram of the drive backplanes shown in FIG. 1-FIG. 6.

The equivalent circuit diagram shown in FIG. 7 may be obtained according to the relation of the film layers shown in FIG. 1 and FIG. 2. As can be seen from FIG. 7, the second source 351 in the read transistor 30 is connected to the third drain 431 in the amplifier transistor 40, and the first polar plate 51 of the memory capacitor 50 is connected to the first source 251 in the reset transistor 20; in addition, the first photosensitive electrode of the photosensor formed on first flat layer 75 is connected to the third gate 41 of the amplifier transistor 40 and the first source 251 of the reset transistor 20, so that the first photosensitive electrode of the photosensor 60, the third gate 41 of the amplifier transistor 40, the first source 251 of the reset transistor 20, and the first polar plate 51 of the memory capacitor 50 are connected.

As shown in FIG. 4 and FIG. 6, the first polar plate 51 is disposed on the same layer as the first source-drain electrode, the second polar plate 52 is disposed on the same layer as the fourth source-drain electrode, and the orthographic projection of the first polar plate 51 on the base plate 10 at least partially overlaps with the orthographic projection of the second polar plate 52 on the base plate 10, so that the memory capacitor 50 is formed by the first polar plate 51 and the second polar plate 52, and in this case, the second passivation layer 76 is used as an insulating dialectic layer between the first polar plate 51 and the second polar plate 52.

The equivalent circuit diagram shown in FIG. 7 may be obtained according to the relation of the film layers shown in FIG. 3 and FIG. 4 or the relation of the film layers shown in FIG. 5 and FIG. 6. As can be seen from FIG. 7, the second source 351 in the read transistor 30 is connected to the fourth drain 462 in the amplifier transistor 40, and the first polar plate 51 of the memory capacitor 50, the fourth gate 44 of the amplifier transistor 40 and the first source 251 of the reset transistor 20 are connected; in addition, the first photosensitive electrode of the photosensor formed on the second flat layer 77 is connected to the first source 251 of the reset transistor 20 and the fourth gate 44 of the amplifier transistor 40, so that the first photosensitive electrode of the photosensor 20, the fourth gate 44 of the amplifier transistor 40, the first source 251 of the reset transistor 20, and the first polar plate 51 of the memory capacitor 50 are connected.

In addition, in FIG. 7, the second polar plate 52 of the memory capacitor 50 is connected to a first power signal line V0, and the first power signal line V0 is used to provide a constant voltage for the second polar plate 52 of the memory capacitor 50 and is disposed on the same layer as the second polar plate 52; the first gate 23 of the reset transistor 20 is connected to a reset signal line Reset, the first drain 252 of the reset transistor 20 is connected to an initialization signal line Vinit, the first gate 23 of the reset transistor 20 is disposed on the same layer as the reset signal line Reset, and the first drain 252 of the reset transistor 20 is disposed on the same layer as the initialization signal line Vinit; the second gate 33 of the read transistor 30 is connected to a gate Gate, the second drain 352 of the read transistor 30 is connected to a read signal line Read, the second gate 33 of the read transistor 30 is disposed on the same layer as the gate Gate, and the second drain 352 of the read transistor 30 is disposed on the same layer as the read signal line Read; the third source 431 or the fourth source 461 of the amplifier transistor 40 is connected to a second power signal line VDD, and the second power signal line Vdd is used to provide a constant high-level signal for the third source 431 or the fourth source 461 of the amplifier transistor 40 and is disposed on the same layer as the third source 431 or the fourth source 461 of the amplifier transistor 40.

Furthermore, the drive backplane comprises M rows and N columns of drive modules, and in this case, the drive backplane comprises M grid lines Gate and N read signal lines Read, wherein the grid lines Gate are distributed in the row direction of the drive backplane, the read signal lines Read are distributed in the column direction of the drive backplane, the second gates 33 of the read transistors of the drive modules in the same row are connected to the same grid line Gate, the second drains 352 of the read transistors 30 of the drive modules in the same column are connected to the same read signal line Read, and M and N are positive integers greater than 1.

It should be noted that only two corresponding arrangements of the memory capacitor 50 are given above, but the specific arrangement of the memory capacitor 50 in the embodiments of the present disclosure is not limited to the two mentioned above. The first polar plate 51 and the second polar plate 52 may be disposed on two sides of any one or multiple insulating dielectric layers. For example, the first photosensitive electrode disposed on the second flat layer 77 may be used as the first polar plate 51, the second polar plate 52 and the fourth source-drain electrode are disposed on the second passivation layer 76 on the same layer, and in this case, the second flat layer 77 is used as an insulating dielectric layer between the first polar plate 51 and the second polar plate 52.

In this embodiment of the present disclosure, multiple amplifier transistors are disposed in the drive backplane and the active layers in the amplifier transistors are made of amorphous silicon or oxide semiconductors, so that the carrier mobility of the amplifier transistors in the drive backplane is uniform, which improves the uniformity of the gains of the amplifier transistors in the drive backplane and avoiding image noises and even defective pixels and lines caused by non-uniform intensities of electric signals amplified by the amplifier transistors, thus improving the imaging quality of images generated according to amplified signal lines.

Figure 8:
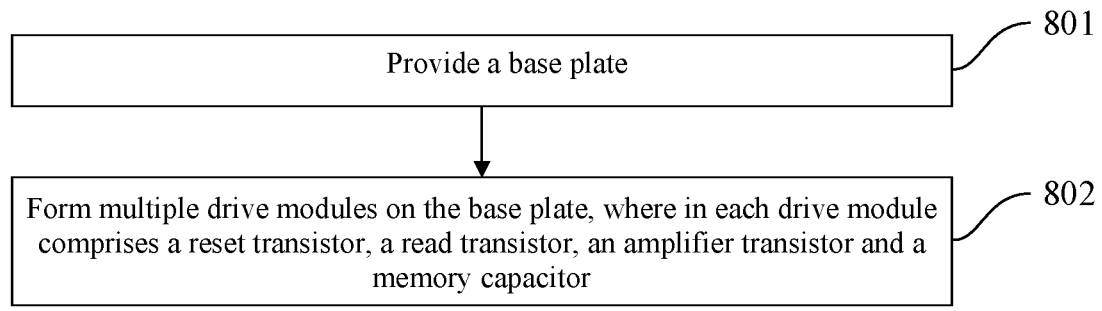
FIG. 8 illustrates a flow diagram of a manufacturing method of a drive backplane according to one embodiment of the present disclosure.

Referring to FIG. 8 which illustrates a flow diagram of a manufacturing method of a drive backplane according to one embodiment of the present disclosure, the manufacturing method may specifically comprise the following steps:

801: a base plate is provided.

In this embodiment of the present disclosure, when the drive backplane is provided, a base plate 10 is provided at first, and the base plate 10 may be a glass base plate.

802: multiple drive modules are formed on the base plate, wherein each drive module comprises a reset transistor, a read transistor, an amplifier transistor and a memory capacitor.

In this embodiment of the present disclosure, multiple drive modules are formed on the base plate 10, and each drive module comprises a reset transistor 20, a read transistor 30, an amplifier transistor 40 and a memory transistor 50, that is, multiple reset transistors 20, multiple read transistors 30, multiple amplifier transistors 40 and multiple memory capacitors 50 are formed on the base plate 10.

Wherein, the reset transistor 20 is connected to the memory capacitor 50 and is configured to reset the memory capacitor 50; the memory capacitor 50 is connected to a photosensor and is configured to store an electric signal generated by the photosensor; the amplifier transistor 40 is connected to the memory capacitor 50 and is configured to amplify the electric signal stored in the memory capacitor 50; the read transistor 30 is connected to the amplifier transistor 40 and is configured to read the electric signal amplified by the amplifier transistor 40; wherein, an active layer in the amplifier transistor 40 is made of amorphous silicon or an oxide semiconductor.

In an optional implementation of the present disclosure, Step 802 specifically comprises the sub-steps S8021-S8029:

S8021: a third gate is formed on the base plate;

S8022: a second grid insulating layer covering the third gate is formed;

S8023: a buffer layer is formed on the second grid insulating layer;

S8024: a first active layer and a second active layer are formed on the buffer layer, and a third active layer is formed on the second grid insulating layer;

S8025: a first grid insulating layer is formed on the first active layer and the second active layer;

S8026: a first gate and a second gate are formed on the first grid insulating layer;

S8027: a second polar plate, and a third source-drain electrode partially covering the third active layer are formed on the second grid insulating layer;

S8028: an interlayer dielectric layer is formed, wherein the interlayer dielectric layer covers the buffer layer, the first active layer, the second active layer, the first grid insulating layer, the first gate, the second gate, the third active layer, the third source-drain electrode, the second polar plate and the second grid insulating layer;

S8029: a first source-drain electrode, a second source-drain electrode and a first polar plate are formed on the interlayer dielectric layer, wherein the first polar plate is connected to a first source in the first source-drain electrode, and a second source in the second source-drain electrode is connected to a third drain in the third source-drain electrode by means of a fifth via hole penetrating through the interlayer dielectric layer.

First of all, a third gate 41 is formed on the base plate 10 by a patterning process; then, a second grid insulating layer 71 covering the third gate 41 and the base plate 10 is formed, a buffer layer 72 is formed on the second grid insulating layer 71 by a patterning process and is only located in an area where the reset transistor 20 and the read transistor 30 are located, and materials, in an area where the amplifier transistor 40 is located, of the buffer layer 72 are etched; next, an amorphous silicon film, located in the area where the reset transistor 20, the read transistor 30 and the amplifier transistor 40 is located, is deposited, and is patterned to form a first active layer 21 and a second active layer 31 on the buffer layer 72; a third active layer 42 is formed on the second grid insulating layer 71, and the whole drive backplane formed with the first active layer 21, the second active layer 31 and the third active layer 42 is processed by excimer laser annealing, so that amorphous silicon of the first active layer 21 of the reset transistor 20 and the second active layer 31 of the read transistor 30 is converted into polysilicon, and the third active layer 42 of the amplifier transistor 40 is still made of amorphous silicon. It should be noted that the third active layer 42 formed in this case refers to a first undoped amorphous silicon layer 421 in the third active layer 42.

After the first active layer 21, the second active layer 31 and the third active layer 42 are formed, a first grid insulating layer 22 is formed on the first active layer 21 and the second active layer 31 by a patterning process; next, a first gate 23 and a second gate 33 are formed on the first grid insulating layer 22 by a patterning process, and ions are implanted into the first doped regions of the first active layer 21 and the second doped regions of the second active layer 31 by a self-alignment process.

After that, a first doped amorphous silicon layer 422 is formed on the first undoped amorphous silicon layer 421 in the third active layer 42 by a patterning process; then, a second polar plate 52, and a third source-drain electrode partially covering the third active layer 42 are formed on the second grid insulating layer 71 by a patterning process.

Then, an interlayer dielectric layer 24 covering the buffer layer 72, the first active layer 21, the second active layer 31, the first grid insulating layer 22, the first gate 23, the second gate 33, the third source-drain electrode, the third active layer 42, the second polar plate 52 and the second grid insulating layer 71 is formed, and a first via hole, a second via hole, a third via hole, a fourth via hole and a fifth via hole penetrating through the interlayer dielectric layer 24 are formed.

Finally, a first source-drain electrode, a second source-drain electrode and a first polar plate 51 are formed on the interlayer dielectric layer 24 by a patterning process. A first source 251 in the first source-drain electrode is connected to the first active layer 21 by means of the first via hole penetrating through the interlayer dielectric layer 24, and a first drain 252 in the first source-drain electrode is connected to the first active layer 21 by means of the second via hole penetrating through the interlayer dielectric layer 24; a second source 351 in the second source-drain electrode is connected to the second active layer 31 via the third via hole penetrating through the interlayer dielectric layer 24, and a second drain 352 in the second source-drain electrode is connected to the second active layer 31 by means of the fourth via hole penetrating through the interlayer dielectric layer 24; the second source 351 in the second source-drain electrode is connected to a third drain 432 in the third source-drain electrode by means of the fifth via hole penetrating through the interlayer dielectric layer 24; and the first polar plate 51 is connected to the first active layer 251 in the first source-drain electrode.

Furthermore, after the first source-drain electrode, the second source-drain electrode and the first polar plate 51 are formed on the interlayer dielectric layer 24, a first passivation layer 74 covering the interlayer dielectric layer 24, the first source-drain electrode, the second source-drain electrode and the first polar plate 51 is formed; and then, a first flat layer 75 is formed on the first passivation layer 74. In addition, the first flat layer 75 is exposed and developed to remove part of the first flat layer 75 to expose the first passivation layer 74, the exposed first passivation layer 74 is etched to form an eighth via hole 752 penetrating through the first flat layer 75 and the first passivation layer 74, and the exposed first passivation layer 74, and the interlayer dielectric layer 24 and the second grid insulating layer 71 below the first passivation layer 74 are etched to form a seventh via hole 751 penetrating through the first flat layer 75, the first passivation layer 74, the interlayer dielectric layer 24 and the second grid insulating layer 71.

Of course, when the third gate 41 is formed on the base plate 10 by the patterning process, a light shielding layer 73 may be formed on the base plate 10 at the same time, wherein the light shielding layer 73 and the third gate 41 are synchronously formed by the same patterning process.

It should be noted that the specific manufacturing process in case where the third active layer 42 is made of amorphous silicon is given above. When the third active layer 42 is made of an oxide semiconductor, the third active layer 42 is formed by an independent patterning process after or before the first gate 23 and the second gate 33 are formed. This embodiment has no limitation in this aspect.

In another optional implementation of the present disclosure, Step 802 specifically comprises the sub-steps S8031-S8038:

S8031: a first active layer and a second active layer are formed on the base plate;

S8032: a first grid insulating layer is formed on the first active layer and the second active layer;

S8033: a first gate and a second gate are formed on the first grid insulating layer;

S8034: an interlayer dielectric layer is formed, wherein the interlayer dielectric layer covers first active layer, the second active layer, the first grid insulating layer, the first gate, the second gate and the base plate;

S8035: a first source-drain electrode, a second source-drain electrode, a fourth gate and a first polar plate are formed on the interlayer dielectric layer;

S8036: a second passivation layer is formed, wherein the second passivation layer covers the interlayer dielectric layer, the first source-drain electrode, the second source-drain electrode, the fourth gate and the first polar plate;

S8037: a fourth active layer is formed on the second passivation layer;

S8038: a second polar plate, and a fourth source-drain electrode partially covering the fourth active layer are formed in the second passivation layer, wherein the fourth gate is connected to a first source in the first source-drain electrode, a fourth drain in the fourth source-drain electrode is connected to a second source in the second source-drain electrode by means of a sixth via hole penetrating through the second passivation layer, and the first polar plate is connected to a first source in the first source-drain electrode.

First of all, a first active layer 21 and a second active layer 31 are formed on the base plate 10 by a patterning process and are processed by excimer laser annealing to convert amorphous silicon of the first active layer 21 and the second active layer 31 into polysilicon; then, a first grid insulating layer 22 is formed on the first active layer 21 and the second active layer 31 by a patterning process, a first gate 23 and a second gate 33 are formed on the first grid insulating layer 22 by a patterning process, and ions are implanted into doped regions of the first active layer 21 and the second active layer 31 by a self-alignment process; next, an interlayer dielectric layer 24 covering the first active layer 21, the second active layer 31, the first grid insulating layer 22, the first gate 23, the second gate 33 and the base plate 10 is formed, and a first via hole, a second via hole, a third via hole and a fourth via hole penetrating through the interlayer dielectric layer 24 are formed;

Then, a first source-drain electrode, a second source-drain electrode, a fourth gate 44 and a first polar plate 51 are formed on the interlayer dielectric layer 24 by a patterning process, wherein a first source 251 in the first source-drain electrode is connected to the first active layer 21 by means of the first via hole penetrating through the interlayer dielectric layer 24, a first drain 252 in the first source-drain electrode is connected to the first active layer 21 by means of the second via hole penetrating through the interlayer dielectric layer 24, a second source 351 in the second source-drain electrode is connected to the second active layer 31 by means of the third via hole penetrating through the interlayer dielectric layer 24, and a second drain 352 in the second source-drain electrode is connected to the second active layer 31 by means of the fourth via hole penetrating through the interlayer dielectric layer 24. In addition, the fourth gate 44, the first polar plate 51, and the first source 251 in the first source-drain electrode are connected.

Next, a second passivation layer 76 is formed, wherein the second passivation layer 76 covers the interlayer dielectric layer 24, the first source-drain electrode, the second source-drain electrode, the fourth gate 44 and the first polar plate 51.

After the second passivation layer 76 is formed, a fourth active layer 45 is formed on the second passivation layer 76 by a patterning process, wherein the fourth active layer 45 is made of amorphous silicon or an oxide semiconductor. When the fourth active layer 45 is made of amorphous silicon, an amorphous silicon layer is formed by a one-step patterning process, and then ions are implanted into the amorphous silicon layer; or, a second undoped amorphous silicon layer 451 and a second doped amorphous silicon 452 are formed by two patterning processes, respectively.

Then, a sixth via hole penetrating through the second passivation layer 76 is formed, and a second polar plate 52, and a fourth source-drain electrode partially covering the fourth active layer 45 are formed on the second passivation layer 76 by a patterning process, so that the fourth source-drain electrode is connected to the second source 351 in the second source-drain electrode by means of the sixth via hole penetrating through the second passivation layer 76.

Furthermore, after the second polar plate 52, and the fourth source-drain electrode partially covering the fourth active layer 45 are formed on the second passivation layer 76, a second flat layer 77 covering the second passivation layer 76, the fourth active layer 45 and the fourth source-drain electrode is formed, and a ninth via hole 771 penetrating through the second flat layer 77 and the second passivation layer 76 is formed.

In this embodiment of the present disclosure, multiple amplifier transistors are disposed in the drive backplane and the active layers in the amplifier transistors are made of amorphous silicon or oxide semiconductors, so that the carrier mobility of the amplifier transistors in the drive backplane is uniform, which improves the uniformity of gains of the amplifier transistors in the drive backplane and avoiding image noises and even defective pixels and lines caused by non-uniform intensities of electric signals amplified by the amplifier transistors, thus improving the imaging quality of images generated according to amplified signal lines.

Figure 9:
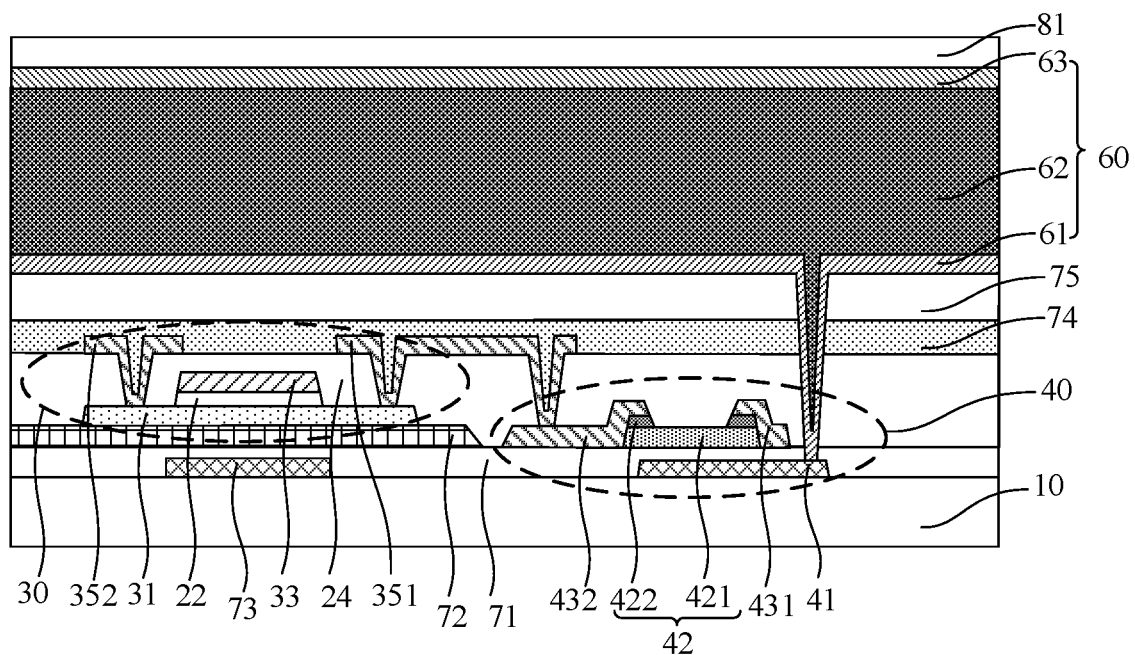
FIG. 9 illustrates a sectional view of a detection substrate corresponding to the drive backplane shown in FIG. 1.
Figure 10:
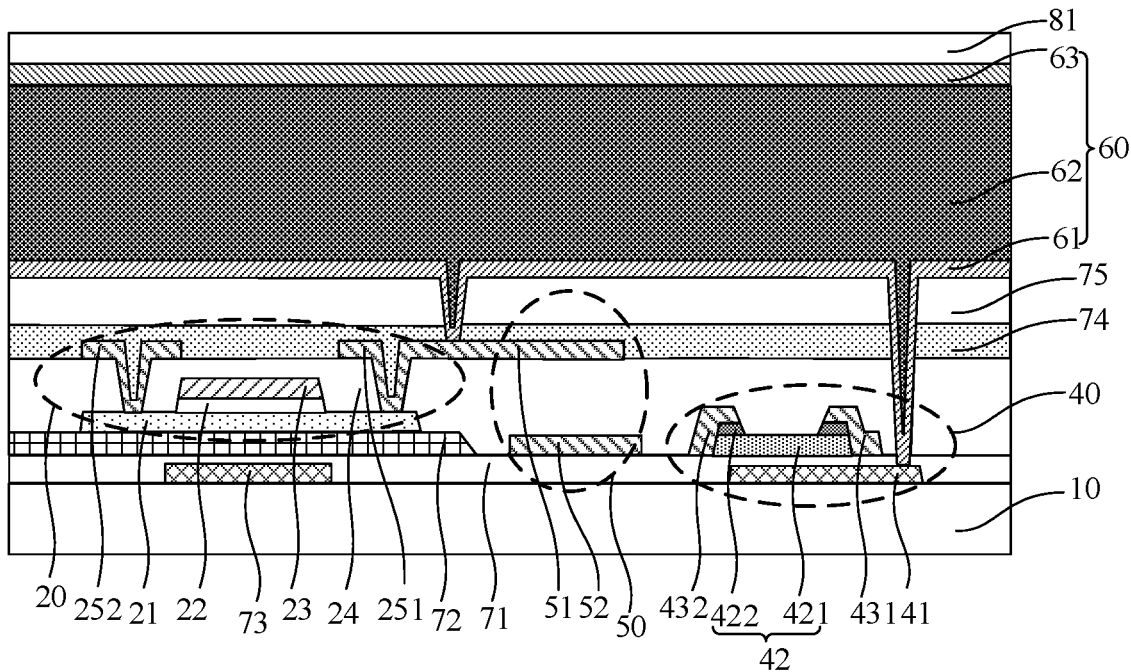
FIG. 10 illustrates a sectional view of a detection substrate corresponding to the drive backplane shown in FIG. 2.
Figure 11:
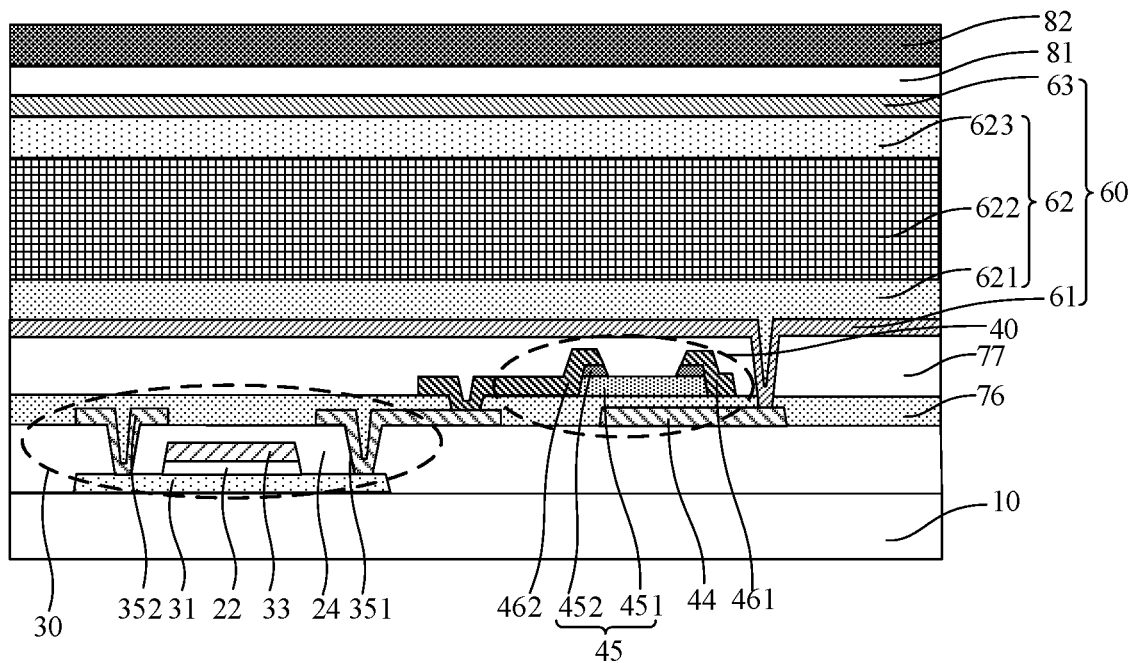
FIG. 11 illustrates a sectional view of a detection substrate corresponding to the drive backplane shown in FIG. 3.
Figure 12:
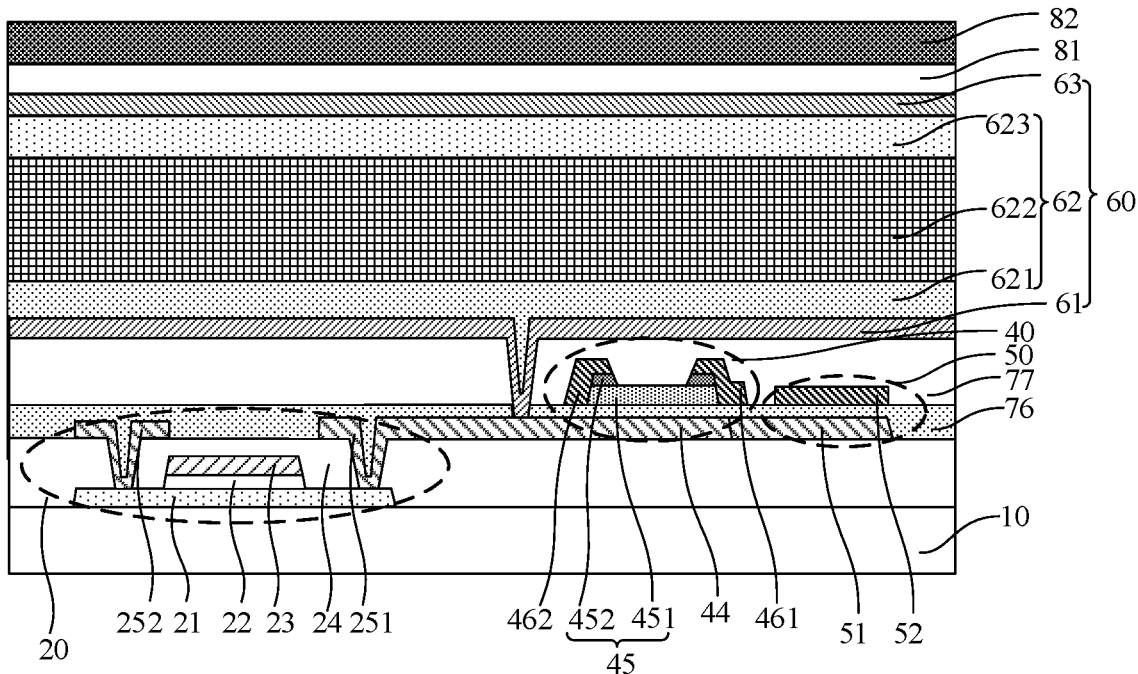
FIG. 12 illustrates a sectional view of a detection substrate corresponding to the drive backplane shown in FIG. 4.

Refer to FIG. 9 which illustrates a sectional view of a detection substrate corresponding to the drive backplane shown in FIG. 1, FIG. 10 which illustrates a sectional view of a detection substrate corresponding to the drive backplane shown in FIG. 2, FIG. 11 which illustrates a sectional view of a detection substrate corresponding to the drive backplane shown in FIG. 3, and FIG. 12 which illustrates a sectional view of a detection substrate corresponding to the drive backplane shown in FIG. 4.

This embodiment of the present disclosure provides a detection substrate comprising a photosensor 60 and the drive backplane, wherein the photosensor 60 is connected to the drive backplane. Specifically, the photosensor 60 is connected to a reset transistor 20, an amplifier transistor 40 and a memory capacitor 50 in the drive backplane.

In this embodiment of the present disclosure, the photosensor 60 comprises a first photosensitive electrode 61, a second photosensitive electrode 63, and a photosensitive layer 62 disposed between the first photosensitive electrode 61 and the second photosensitive electrode 63.

As shown in FIG. 9 and FIG. 10, the first photosensitive electrode 61 is connected to a third gate 41 by means of a seventh via hole 751 penetrating through a first flat layer 75, a first passivation layer 74, an interlayer dielectric layer 24 and a second grid insulating layer 71, and is connected to a first source 251 in a first source-drain electrode by means of an eighth via hole 752 penetrating through the first flat layer 75 and the first passivation layer 74. In this case, the first photosensitive 61 is disposed on a side, away from the base plate 10, of the first flat layer 75.

As shown in FIG. 11 and FIG. 12, the first photosensitive electrode 61 is connected to a fourth gate 44 through a ninth via hole 771 penetrating through a second flat layer 77 and a second passivation layer 76. In this case, the first photosensitive electrode 61 is disposed on a side, away from the base plate 10, of the second flat layer 77.

Wherein, the first photosensitive electrode 61 is used as a lower electrode of the photosensor 60, and the second photosensitive electrode 63 is used as an upper electrode of the photosensor 60. To ensure that rays can normally pass through the second photosensitive electrode 63 to be irradiated onto a photosensitive layer 62, the second photosensitive electrode 63 needs to be made of a transparent electrically conductive material, that is, the material of the second photosensitive electrode 63 is a transparent electrically conductive material such as Indium Tin Oxides (ITO).

In an optional implementation of the present disclosure, the photosensitive layer 62 is made of a direct conversion material that is able to directly convert X-rays, γ-rays or other rays into electric signals, such as an organic material, perovskite, mercury iodide, lead iodide, lead oxide, bismuth iodide or Cd1-xZnxTe. In this case, a third passivation layer 81 is disposed on a side, away from the photosensitive layer 62, of the second photosensitive electrode 63.

In another optional implementation of the present disclosure, the detection substrate further comprises a third passivation layer 81 and a scintillant layer 82 that are disposed on a side, away from the photosensitive layer 62, of the second photosensitive layer 63; and the photosensitive layer 63 comprises a first doped layer 621, an intrinsic layer 622 and a second doped layer 623 that are sequentially disposed on a side, away from the drive backplane, of the first photosensitive electrode 61.

In this case, the photosensitive layer 62 is actually a photodiode that is unable to directly convert X-rays, γ-rays or other rays into electric signals and is only able to convert visible light into electric signals, so the scintillant layer 82 is additionally arranged to convert X-rays, γ-rays or other rays into visible light, which is then irradiated onto the photosensitive layer by the third passivation layer 81 and the second photosensitive electrode 63, so that the visible light is converted by the photosensitive layer 62 into an electric signal.

Wherein, the first doped layer 621 may be a P-type layer, the intrinsic layer 622 may be an I-type layer, and the second doped layer 623 may be an N-type layer; or, the first doped layer 621 may be an N-type layer, the intrinsic layer 622 may be an I-type layer, and the second doped layer 623 may be an I-type layer. In addition, the I-type layer is made of perovskite, and the P-type layer and the N-type layer are made of organic or inorganic materials; or, the P-type layer, the I-type layer and the N-type layer are all made of organic materials.

It should be noted that in the structure shown in FIG. 9 and FIG. 10, the photosensitive layer 62 is made of a direct conversion material, that is, the photosensitive layer 62 is a direct conversion type photosensitive layer 62; in the structure shown in FIG. 11 and FIG. 12, the photosensitive layer 62 is made of a photodiode, that is, the photosensitive layer 62 is an indirect conversion type photosensitive layer 62. These two photosensitive layers 62 may be disposed on the drive backplane in shown in any one of FIG. 1 to FIG. 6, and the present disclosure is not limited to the configuration that the direct conversion type photosensitive layer 62 is disposed on the drive backplane shown in FIG. 1 and FIG. 2 and the configuration that the indirect conversion type photosensitive layer 62 is disposed on the drive backplane shown in FIG. 3 and FIG. 4.

As shown in FIG. 9 to FIG. 12, an orthographic projection of the photosensor 60 on the base plate covers orthographic projections of the reset transistor 20, the read transistor 30, the amplifier transistor 40 and the memory capacitor 50 on the base plate 10. That is, the photosensor 60 is disposed on the whole drive backplane, and the proportion of the area of the photosensor 60 to the area of the whole detection substrate basically reaches 100%, so that the fill factor of the detection substrate is increased, the reset transistor 20, the read transistor 30, the amplifier transistor 40 and the memory capacitor 50 in the drive backplane are prevented from occupying too many photosensitive area, and the photoelectric conversion efficiency is improved.

Or, the orthographic projection of the photosensor 60 on the base plate 10 does not overlap with the orthographic projections of the reset transistor 20, the read transistor 30, the amplifier transistor 40 and the memory capacitor 50 on the base plate 10.

In this case, the area of the detection substrate is equal to the sum of the area of the reset transistor 20, the area of the read transistor 30, the area of the amplifier transistor 40, the area of the memory capacitor 50, and the area of the photosensor 60, and the area of the photosensor 60 accounts for 60%-70% of the area of the detection substrate.

One embodiment of the present disclosure further provides a detection device comprising the detection substrate. The detection device may be a flat panel detector (FPD).

In this embodiment of the present disclosure, multiple amplifier transistors are disposed in the drive backplane and the active layers in the amplifier transistors are made of amorphous silicon or oxide semiconductors, so that the carrier mobility of the amplifier transistors in the drive backplane is uniform, which improves the uniformity of the gains of the amplifier transistors in the drive backplane and avoiding image noises and even defective pixels and lines caused by non-uniform intensities of electric signals amplified by the amplifier transistors, thus improving the imaging quality of images generated according to amplified signal lines.

The embodiments in this specification are described progressively, the differences from other embodiments are emphatically stated in each embodiment, and the similarities of these embodiments may be cross-referenced.

Finally, it should be noted that relational terms such as "first" and "second" in this specification are merely used to distinguish one entity or operation from the other one, and do not definitely indicate or imply that these entities or operations have any actual relations or sequences. In addition, the term "comprise" or "include" or other variations are intended to refer to non-exclusive inclusion, so that a process, method, article or device comprising a series of elements not only comprises these elements listed, but also comprises other elements that are not clearly listed, or inherent elements of the process, method, article or device. Unless otherwise clearly specified, an element defined by the expression "comprise a" shall not exclusive of other identical elements in a process, method, article or device comprising said element.

The drive backplane, the manufacturing method thereof, the detection substrate and the detection device provided by the present disclosure are introduced in detail above, specific examples are used in this specification to expound the principle and implementation of the present disclosure, and the description of the above embodiments is merely used to assist those skilled in the art in understanding the method and core concept thereof of the present disclosure. In addition, those ordinarily skilled in the art can make changes to the specific implementation and invention scope based on the concept of the present disclosure. So, the contents of the specification should not be construed as limitations of the present disclosure.

The invention claimed is:

1. A drive backplane, comprising a base plate and multiple drive modules disposed on the base plate, wherein each said drive module comprises a reset transistor, a read transistor, an amplifier transistor and a memory capacitor;
   the reset transistor is connected to the memory capacitor, and the reset transistor is configured to reset the memory capacitor;
   the memory capacitor is connected to a photosensor, and the memory capacitor is configured to store an electric signal generated by the photosensor;
   the amplifier transistor is connected to the memory capacitor, and the amplifier transistor is configured to amplify the electric signal stored in the memory capacitor;
   the read transistor is connected to the amplifier transistor, and the read transistor is configured to read an electric signal amplified by the amplifier transistor;
   wherein, an active layer in the amplifier transistor is made of amorphous silicon or an oxide semiconductor;
   wherein the reset transistor comprises a first active layer, a first grid insulating layer, a first gate, an interlayer dielectric layer and a first source-drain electrode that are sequentially disposed on a side of the base plate;
   wherein the read transistor comprises a second active layer, the first grid insulating layer, a second gate, the interlayer dielectric layer and a second source-drain electrode that are sequentially disposed on a side of the base plate;
   wherein the drive backplane further comprises a buffer layer and a second grid insulating layer that are disposed between the base plate and the first active layer, and the buffer layer is disposed on a side, away from the base plate, of the second grid insulating layer;

the amplifier transistor comprises a third gate, the second grid insulating layer, a third active layer and a third source-drain electrode that are sequentially disposed on the base plate; the second source in the second source-drain electrode is connected to a third drain in the third source-drain electrode by means of a fifth via hole penetrating through the interlayer dielectric layer; and wherein, an orthographic projection of the third active layer on the base plate does not overlap with an orthographic projection of the buffer layer on the base plate.

2. The drive backplane according to claim 1, wherein the third active layer is made of amorphous silicon, and comprises a first undoped amorphous silicon layer disposed on the second grid insulating layer and a first doped amorphous silicon layer disposed on the first undoped amorphous silicon layer;

or, the third active layer is made of an oxide semiconductor.

3. The drive backplane according to claim 1, wherein the drive backplane further comprises a light shielding layer disposed on the base plate, and the light shielding layer located on the same layer as the third gate; and the second grid insulating layer covers the light shielding layer.

4. The drive backplane according to claim 1, wherein a first source in the first source-drain electrode is connected to the first active layer by means of a first via hole penetrating through the interlayer dielectric layer, and a first drain in the first source-drain electrode is connected to the first active layer by means of a second via hole penetrating through the interlayer dielectric layer; and the memory capacitor comprises a first polar plate and a second polar plate that are arranged oppositely, the first polar plate is disposed on a same layer as the first source-drain electrode, the second polar plate is disposed on a same layer as a fourth source-drain electrode of the amplifier transistor or the third source-drain electrode, and the first polar plate is connected to the first source in the first source-drain electrode;

wherein, an orthographic projection of the first polar plate on the base plate at least partially overlaps with an orthographic projection of the second polar plate on the base plate.

5. A manufacturing method of the drive backplane according to claim 1, comprising:

providing the base plate; and forming the multiple drive modules on the base plate, wherein each said drive module comprises the reset transistor, the read transistor, the amplifier transistor and the memory capacitor;

wherein, the reset transistor is connected to the memory capacitor, and the reset transistor is configured to reset the memory capacitor;

the memory capacitor is connected to the photosensor, and the memory capacitor is configured to store the electric signal generated by the photosensor;

the amplifier transistor is connected to the memory capacitor, and the amplifier transistor is configured to amplify the electric signal stored in the memory capacitor;

the read capacitor is connected to the amplifier transistor, and the read capacitor is configured to read the electric signal amplified by the amplifier transistor; and an active layer in the amplifier transistor is made of the amorphous silicon or the oxide semiconductor.

6. The drive backplane according to claim 1, wherein the drive backplane further comprises a first passivation layer covering the interlayer dielectric layer, the first source-drain electrode and the second source-drain electrode, and a first flat layer disposed on the first passivation layer;

wherein, the first passivation layer is made of silicon nitride and/or silicon oxide, and the first flat layer is made of resin.

7. The drive backplane according to claim 6, wherein a first source in the first source-drain electrode is connected to the first active layer by means of a first via hole penetrating through the interlayer dielectric layer, and a first drain in the first source-drain electrode is connected to the first active layer by means of a second via hole penetrating through the interlayer dielectric layer; and the drive backplane further comprises a seventh via hole penetrating through the first flat layer, the first passivation layer, the interlayer dielectric layer and the second grid insulating layer, and an eighth via hole penetrating through the first flat layer and the first passivation layer;

wherein the seventh via hole is configured to connect the third gate of the amplifier transistor and a first photosensitive electrode of the photosensor, and the eighth via hole is configured to connect the first source and the first photosensitive electrode.

8. A detection substrate, comprising a photosensor, and the drive backplane according to claim 1, wherein the photosensor is connected to the drive backplane.

9. A detection device, comprising the detection substrate according to claim 8.

10. The drive backplane according to claim 1, wherein a first source in the first source-drain electrode is connected to the first active layer by means of a first via hole penetrating through the interlayer dielectric layer, and a first drain in the first source-drain electrode is connected to the first active layer by means of a second via hole penetrating through the interlayer dielectric layer.

11. The drive backplane according to claim 10, wherein the first active layer comprises a first undoped region and a first doped regions located on two sides of the first undoped region; and the first source is connected to the first active layer located at the first doped region, and the first drain is connected to the first active layer located at the first doped region.

12. The drive backplane according to claim 11, wherein in case where the reset transistor is a P-type transistor, the first doped regions are doped with boron ions;

or, in case where the reset transistor is an N-type transistor, the first doped regions are doped with phosphorus ions.

13. The drive backplane according to claim 10, wherein a second source in the second source-drain electrode is connected to the second active layer by means of a third via hole penetrating through the interlayer dielectric layer, and a second drain in the second source-drain electrode is connected to the second active layer by means of a fourth via hole penetrating through the interlayer dielectric layer;

wherein, the first active layer and the second active layer are disposed on a same layer, the first gate and the second gate are disposed on a same layer, and the first source-drain electrode and the second source-drain electrode are disposed on a same layer.

14. The drive backplane according to claim 13, wherein the first active layer and the second active layer are made of polysilicon.

15. The drive backplane according to claim 13, wherein the second active layer comprises a second undoped region and a second doped regions located on two sides of the second undoped region; and the second source is connected to the second active layer located at the second doped region, the second drain is connected to the second active layer located at the second doped region.

16. The drive backplane according to claim 15, wherein in case where the read transistor is a P-type transistor, the second doped regions are doped with boron ions;

or, in case where the read transistor is an N-type transistor, the second doped regions are doped with phosphorus ions.

17. A drive backplane, comprising a base plate and multiple drive modules disposed on the base plate, wherein each said drive module comprises a reset transistor, a read transistor, an amplifier transistor and a memory capacitor;

the reset transistor is connected to the memory capacitor, and the reset transistor is configured to reset the memory capacitor;

the memory capacitor is connected to a photosensor, and the memory capacitor is configured to store an electric signal generated by the photosensor;

the amplifier transistor is connected to the memory capacitor, and the amplifier transistor is configured to amplify the electric signal stored in the memory capacitor;

the read transistor is connected to the amplifier transistor, and the read transistor is configured to read an electric signal amplified by the amplifier transistor;

wherein, an active layer in the amplifier transistor is made of amorphous silicon or an oxide semiconductor;

wherein the reset transistor comprises a first active layer, a first grid insulating layer, a first gate, an interlayer dielectric layer and a first source-drain electrode that are sequentially disposed on a side of the base plate;

wherein, a first source in the first source-drain electrode is connected to the first active layer by means of a first via hole penetrating through the interlayer dielectric layer, and a first drain in the first source-drain electrode is connected to the first active layer by means of a second via hole penetrating through the interlayer dielectric layer;

wherein the read transistor comprises a second active layer, the first grid insulating layer, a second gate, the interlayer dielectric layer and a second source-drain electrode that are sequentially disposed on a side of the base plate;

a second source in the second source-drain electrode is connected to the second active layer by means of a third via hole penetrating through the interlayer dielectric layer, and a second drain in the second source-drain electrode is connected to the second active layer by means of a fourth via hole penetrating through the interlayer dielectric layer;

wherein, the first active layer and the second active layer are disposed on a same layer, the first gate and the second gate are disposed on a same layer, and the first source-drain electrode and the second source-drain electrode are disposed on a same layer;

wherein the drive backplane further comprises a second passivation layer covering the interlayer dielectric layer, the first source-drain electrode and the second source-drain electrode;

the amplifier transistor comprises a fourth gate, the second passivation layer, a fourth active layer and a fourth source-drain electrode that are sequentially disposed on the interlayer dielectric layer; and wherein, the fourth gate is disposed on a same layer as the first source-drain electrode and the second source-drain electrode and is connected to the first active layer in the first source-drain electrode; a fourth drain in the fourth source-drain electrode is connected to the second source in the second source-drain electrode by means of a sixth via hole penetrating through the second passivation layer.

18. A manufacturing method of the drive backplane according to claim 17, comprising:

providing the base plate; and forming the multiple drive modules on the base plate, wherein each said drive module comprises the reset transistor, the read transistor, the amplifier transistor and the memory capacitor;

wherein, the reset transistor is connected to the memory capacitor, and the reset transistor is configured to reset the memory capacitor;

the memory capacitor is connected to the photosensor, and the memory capacitor is configured to store the electric signal generated by the photosensor;

the amplifier transistor is connected to the memory capacitor, and the amplifier transistor is configured to amplify the electric signal stored in the memory capacitor;

the read capacitor is connected to the amplifier transistor, and the read capacitor is configured to read the electric signal amplified by the amplifier transistor; and an active layer in the amplifier transistor is made of the amorphous silicon or the oxide semiconductor.

19. The drive backplane according to claim 17, wherein the fourth active layer is made of amorphous silicon, and comprises a second undoped amorphous silicon layer disposed on the second passivation layer and a second doped amorphous silicon layer disposed on the second undoped amorphous silicon layer;

or, the fourth active layer is made of an oxide semiconductor.

20. The drive backplane according to claim 19, wherein in case where the fourth active layer is made of amorphous silicon, the second passivation layer is made of silicon nitride, and the thickness of the second passivation layer is 300 nm-500 nm;

or, in case where the fourth active layer is made of the oxide semiconductor, the second passivation layer is made of silicon oxide, and the thickness of the second passivation is 100 nm-200 nm.

* * * * *